(12) United States Patent
Naganuma et al.

(10) Patent No.: US 9,391,098 B2
(45) Date of Patent: Jul. 12, 2016

(54) METHOD OF MANUFACTURING A DISPLAY DEVICE

(71) Applicant: Japan Display Inc., Tokyo (JP)

(72) Inventors: Tomohiko Naganuma, Tokyo (JP); Yasukazu Kimura, Tokyo (JP); Takuma Nishinohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/737,023

(22) Filed: Jun. 11, 2015

(65) Prior Publication Data

US 2015/0364506 A1 Dec. 17, 2015

(30) Foreign Application Priority Data

Jun. 16, 2014 (JP) .................................. 2014-123284

(51) Int. Cl.
*H01L 21/50* (2006.01)
*H01L 27/12* (2006.01)

(52) U.S. Cl.
CPC ........ *H01L 27/1262* (2013.01); *H01L 27/1266* (2013.01)

(58) Field of Classification Search
CPC .......................... H01L 27/1262; H01L 27/1266

USPC ........................................................ 438/125
See application file for complete search history.

(56) References Cited

U.S. PATENT DOCUMENTS

| 2007/0152577 A1 | 7/2007 | Cho et al. | |
| 2010/0215873 A1* | 8/2010 | Liao | ...................... G02F 1/1333 428/1.33 |
| 2014/0285914 A1* | 9/2014 | Sakano | ...................... G02B 5/20 359/892 |

FOREIGN PATENT DOCUMENTS

JP   2007-183605 A   7/2007

* cited by examiner

*Primary Examiner* — Luan C Thai
(74) *Attorney, Agent, or Firm* — Typha IP LLC

(57) ABSTRACT

An object of the present invention is to improve yield when manufacturing a display device. A method of manufacturing a display device for displaying an image using a display element includes exposing a first surface of a glass substrate o an aqueous solution containing hydrogen fluoride, forming an organic resin film having a polar group above the first surface of the glass substrate, forming a layer including a display element for displaying an image above the organic resin film, and bonding an opposing substrate so as to cover the display element.

12 Claims, 6 Drawing Sheets

METHOD OF MANUFACTURING A DISPLAY DEVICE

CROSS REFERENCE TO RELATED APPLICATIONS

This application is based upon and claims the benefit of priority from the prior Japanese Patent Application No. 2014-123284, filed on Jun. 16, 2014, the entire contents of which are incorporated herein by reference.

FIELD

The present invention relates to a method of manufacturing a display device.

BACKGROUND

A display device which used liquid crystals or OLED (Organic Light Emitting Diode) is conventionally manufactured by forming a display element above a glass substrate. In recent years, display devices are being developed which can be bent by forming a display element above a substrate which includes flexible properties (for example, Japanese Laid Open Patent 2007-183605).

In the case where an organic resin film including flexible properties is formed above a glass substrate and a display element is formed above the organic resin film, a phenomenon which is the cause of reducing yield of display device sometimes occurs at the boundary between the glass substrate and organic resin film. The present invention aims to improve yield when manufacturing a display device.

SUMMARY

A method of manufacturing a display device for displaying an image using a display element includes exposing a first surface of a glass substrate to an aqueous solution containing hydrogen fluoride, forming an organic resin film having a polar group on the first surface of the glass substrate, forming a layer including a display element for displaying an image above the organic resin film, and bonding an opposing substrate so as to cover the display element.

DESCRIPTION OF EMBODIMENTS

Each embodiment of the present invention is explained below while referring to the diagrams. Furthermore, the disclosure is merely an example and appropriate modifications could be conceived while maintaining the scope of the invention which are also included in the scope of the present invention. In addition, in order to better clarify the invention, the width and shape etc of each part in drawings are sometimes shown schematically compared to the actual forms and should not be interpreted as limiting the present invention. In addition, in the specification and each drawing, the same reference symbols are attached to similar elements which have previously been described and a detailed explanation of these elements may be omitted where appropriate.

<EMBODIMENTS>
[Summary Structure]

The display device in one embodiment of the present invention is an organic EL (Electro-luminescence) display device which used an OLED. This display device includes flexibility. Furthermore, the display device in the present embodiment is not limited to a self-emitting type display device such as an organic EL display device and may be a liquid crystal display device using liquid crystals, an electronic paper type display device which uses an electrophoretic element or any other display device.

The display device uses an organic resin film which includes flexibility in a substrate. A display element for displaying an image is formed above the substrate including flexibility (sometimes referred to below as flexible substrate). A drive element such as a thin film transistor (TFT) for controlling the light emitting state of an OLED is included in the display element. The flexible substrate is supported by a glass substrate when forming a thin film transistor and is peeled from the glass substrate in the manufacturing process of the display device.

A manufacturing method of a display device explained below is for improving yield when manufacturing up to at least the process of peeling a flexible substrate from a glass substrate. The structure and manufacturing method of a display device in one embodiment of the present invention is explained below.

Figure 1:
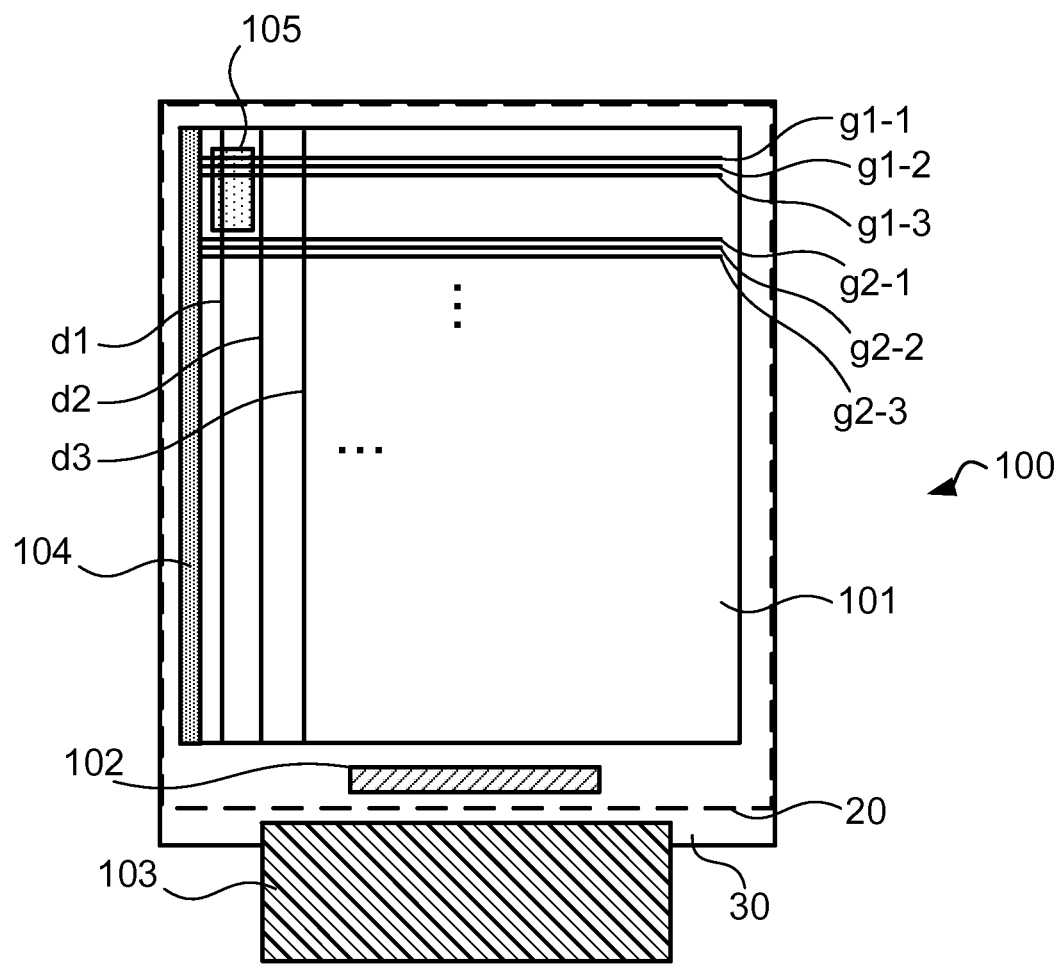
FIG. 1 is a planar diagram showing a schematic structure of a display device in one embodiment.

FIG. 1 is a planar view diagram showing a schematic structure of a display device in one embodiment. The display device 100 is arranged with a display region 101, a driver IC 102, a FPC (Flexible Printed Circuit) 103 and a scanning line drive circuit 104. The driver IC 102 and scanning line drive circuit 104 are formed above a flexible substrate 30.

A plurality of scanning lines g1-1, g1-2, g1-3, g2-1, g2-2, g2-3, . . . running in a horizontal direction in the diagram, and a plurality of data signal lines d1, d2, d3, . . . running in a vertical direction are arranged to intersect each other in the display region 101. A plurality of pixels 105 are arranged in a matrix shape at a position corresponding to an intersecting section between the scanning lines and data lines. Although a structure is exemplified in FIG. 1 in which three scanning lines g1-1~g1-3 and one data signal line d1 are arranged to intersect each other per one pixel 105, the present invention is not limited to this structure. Furthermore, wiring which supplies a certain voltage such as a power source line may also be arranged with the display region 101.

The scanning line drive circuit 104 supplies a control signal to a scanning line. The driver IC 102 supplies a data voltage to a data signal line, and controls the scanning line drive circuit 104. A display element including a pixel circuit for controlling emitted light based on a control signal and data voltage, and a light emitting element (OLED) which controls emitted light using the pixel circuit are arranged in each pixel 105.

An opposing substrate 20 is an organic resin film substrate including flexibility formed with a color filter and light blocking material (Black Matrix) etc. The opposing substrate 20 is bonded together with the flexible substrate 30 so as to cover a pixel circuit of each pixel 105. In this example, a filler is filled between the flexible substrate 30 and the opposing substrate 20.

Figure 2:
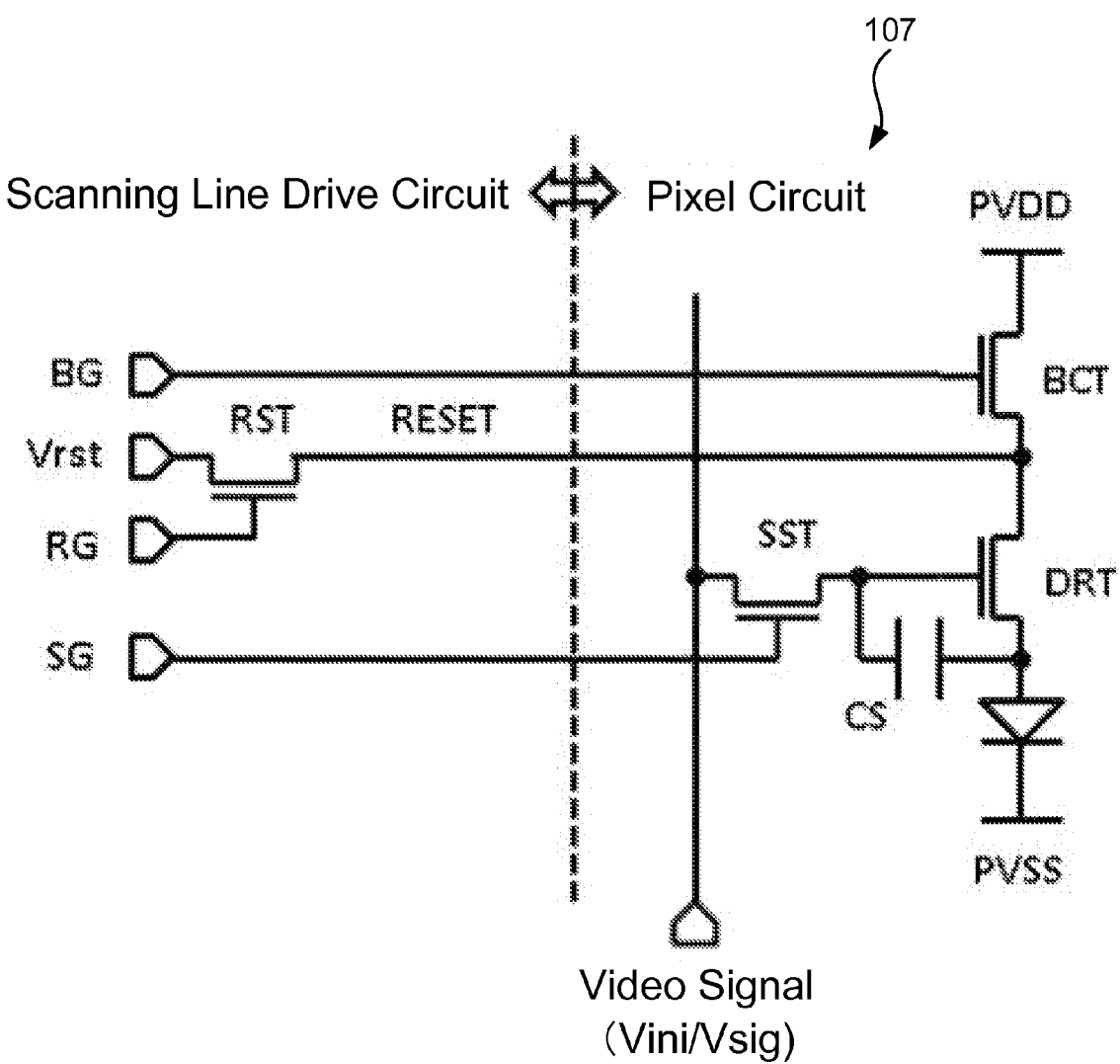
FIG. 2 is a circuit diagram showing an example of a pixel circuit used in a display device in one embodiment.

FIG. 2 is a circuit diagram showing an example of a pixel circuit used in the display device in one embodiment. In FIG. 2, the sections to the right of the dotted line are included in each pixel circuit 105 and is arranged with a pixel circuit including three transistors SST, BCT, DRT, and a light emitting element (OLED). The transistor BCT is sometimes shared between a plurality of adjacent pixels. In FIG. 2, a signal line input with a video signal (Vini, Vsig) corresponds to the data signal line d1 shown in FIG. 1. The scanning lines BG, RG, SG each correspond to the scanning lines g1-1, g1-2, g1-3 shown in FIG. 1. A display device arranged with this structure corrects a threshold voltage of the transistor DRT, corrects variation in electric field effect mobility, supplies a current value to an OLED according the video signal (Vsig) and thereby it is possible for the OLED to emit light at a luminosity according to the current value. Furthermore, the structure of the pixel circuit is only an example and other circuit structures are also possible.

Figure 3:
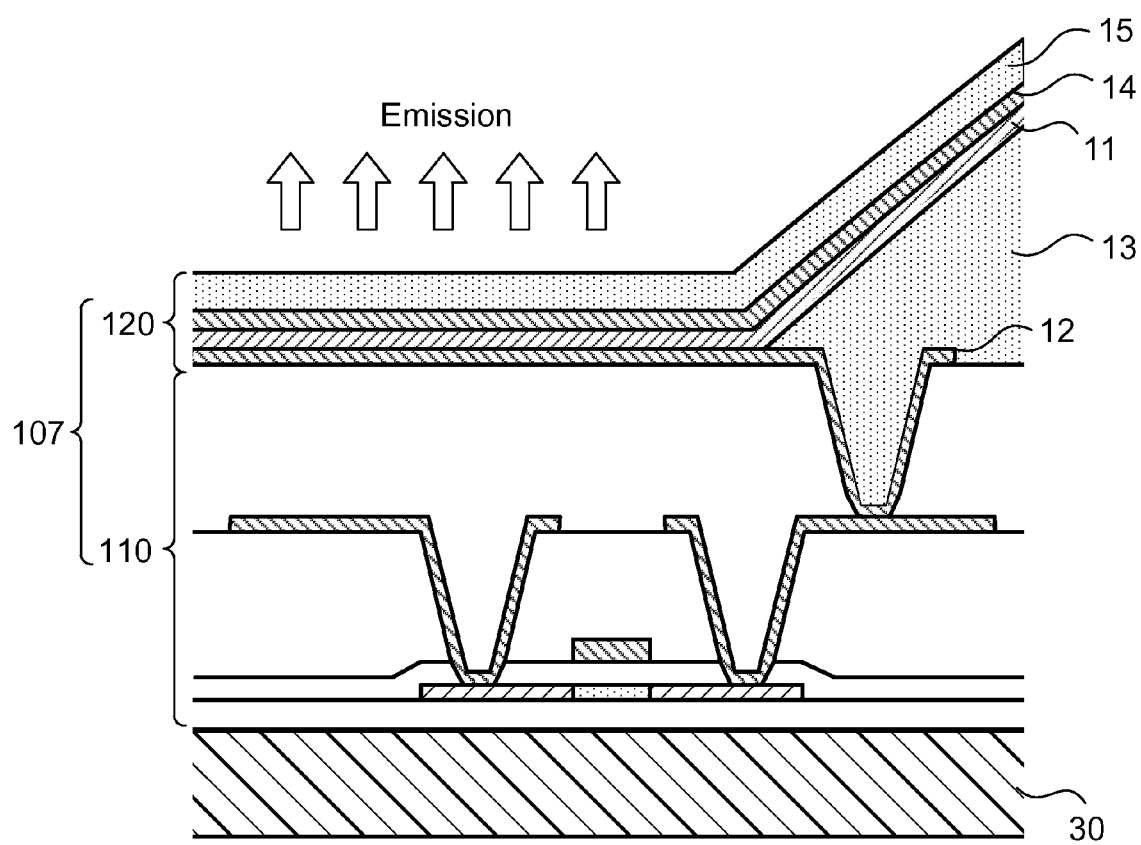
FIG. 3 is the schematic diagram showing a cross-sectional structure of a flexible substrate side of the display device in one embodiment.

FIG. 3 is schematic diagram showing a cross-sectional structure of a flexible substrate side of the display device in one embodiment. A transistor part 110 corresponding to each of the transistors described above is formed in the flexible substrate 30. Furthermore, in FIG. 3 the transistor 110 is shown as a part corresponding to the transistor DRT.

A pixel electrode 12 connected with the transistor part 110 is formed via a contact hole formed in a planarized film in the transistor part 110. A bank 13 for separating adjacent pixel is formed as well as burying the contact hole. A light emitting layer 11 including an OLED is formed above the pixel electrode 12. An opposing electrode 14 is formed above the light emitting layer 11. In this example, an OLED emits white light using a current supply from the pixel electrode 12 to the opposing electrode 14. As a result, the OLED emits light in a region sandwiched between the pixel electrode 12 and opposing electrode 14. In addition, light emitted in each color (for example, RGB, RGBW etc) is realized by passing the light through a color filter arranged in the opposing substrate 20. Furthermore, the present invention is not limited to the case of realizing RGB using a color filter using an OLED which emits white light in all the pixels, RGB may also be realized by separating and arranging an OLED which emits red light, an OLED which emits green light and an OLED which emits blue light in each pixel.

A sealing film 15 is formed above the opposing electrode 14. In this example, the sealing layer is formed using silicon nitride (SiNx). In addition, in this example, the display device 100 has a top emission type structure in which white light is emitted towards the opposite side (upper side in the diagram) of the transistor part 110 and from the opposing substrate 20 side. As a result, the opposing electrode 14 is formed so as to include translucency. Furthermore, although the display device 100 has a top emission type structure in the present example, a bottom emission type structure in which light is emitted to the transistor side is also possible. Furthermore, in the explanation below, a light emitting element 120 indicates the pixel electrode 12, light emitting layer 11, opposing electrode 14 and sealing film 15 etc. Therefore, the display element 107 described above includes the transistor part 110 and the light emitting element 120. Furthermore, although the color filter mentioned previously is arranged on the opposing substrate 20 side, a color filter may be arranged on a path until light emitted from an OLED is visually confirmed, for example, above the opposing substrate 14 or above the sealing film 15.

[Manufacturing Method of the Display Device 100]

Next, a manufacturing method of the display device 100 is explained.

Figure 4A:
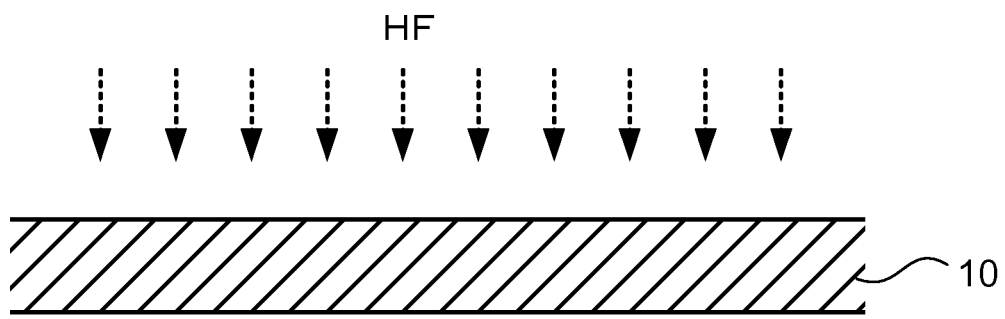
FIG. 4A~4C are diagrams for explaining a method of manufacturing a display device in one embodiment.
Figure 4B:
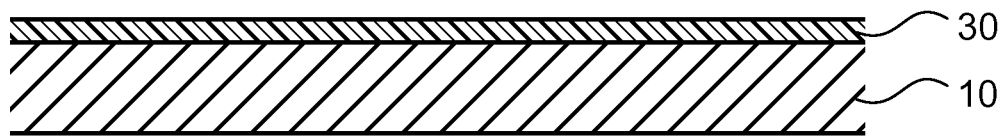
Figure 4C:
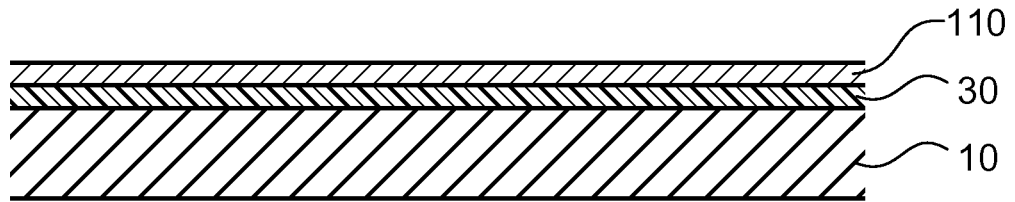

FIG. 4A~4C are diagrams for explaining a manufacturing method of a display device in one embodiment. First, a glass substrate 10 which supports the flexible substrate 30 is prepared as a support substrate. The thickness of the glass substrate 10 is 0.1 mm or more and 1.0 mm or less and preferably 0.3 mm or more and 0.8 mm or less.

As is shown in FIG. 4A, at least one surface (upper side surface in the diagram, sometimes referred to herein as first surface) of the glass substrate 10 is cleaned using a aqueous solution including hydrogen fluoride (sometimes referred to herein simply as hydrofluoric acid). In this example, a aqueous solution including hydrogen fluoride with a concentration of 0.5% is exposed to the first surface of the glass substrate 10 for about 20 seconds. Furthermore, the conditions such as concentration and processing time etc can be appropriately set. Furthermore, cleaning may be carried using a method such as a paddle method, spin method or dip method.

Next, as is shown in FIG. 4B, the flexible substrate 30 is formed above the first surface of the glass substrate 10. The flexible substrate 30 is an organic resin film and is formed using polyimide in this example. In this case, for example, it is possible to form the flexible substrate 30 on the first surface of the glass substrate 10 by coating the solution including soluble polyimide on the first surface of the glass substrate 10 and baking. The thickness of the flexible substrate 30 is for example 1 μm or more and 100 μm or less and preferably 5 μm or more and 50 μm or less.

Furthermore, the flexible substrate 30 is not limited to polyimide and can be formed using another organic resin film, however it is preferred that the flexible substrate 30 is formed using a material having a maximum temperature (at least 300° C., for example 400° C.) heat resistance in a thermal process when forming the transistor part 110. The flexible substrate 30 is preferred to be an organic resin film including a polar group even in the case where polyimide is not used. For example, PEN (polyethylene naphthalate).

Next, as is shown in FIG. 4C, the transistor part 10 described above is formed above the flexible substrate 30 which is an organic resin film. When forming the transistor part, a thermal process is carried out by film formation, film quality improvement etc by CVD (Chemical Vapor Deposition). At this time, the temperature rises to around 400° C.

In the case where cleaning using hydrofluoric acid explained in FIG. 4A is not performed, when the rise in temperature exceeds 300° C., a phenomenon sometimes occurs in which the flexible substrate 30 (the organic resin film) is peeled from the glass substrate 10. This phenomenon which occurs in the case where cleaning is not performed using hydrofluoric acid is explained in a comparative example.

Figure 5A:
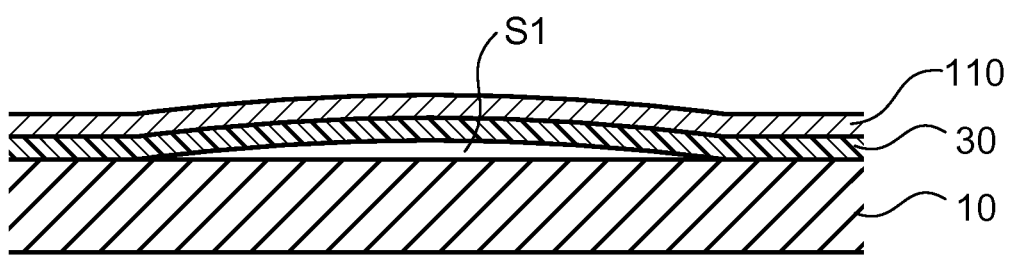
FIG. 5A~FIG. 5B are diagrams for explaining an example in which a film is peeled off using the method of manufacturing the display device in a comparative example.
Figure 5B:
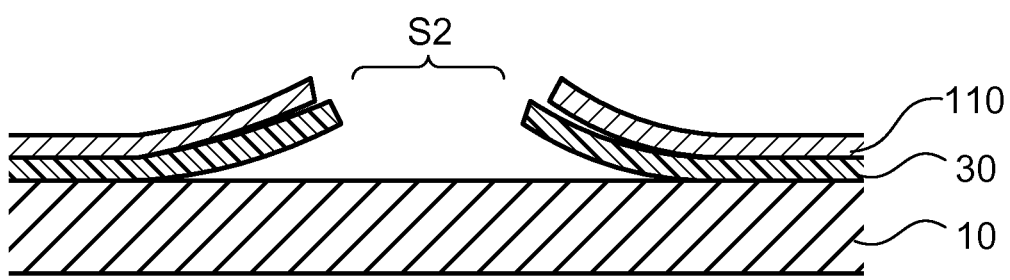

FIG. 5A~5B are diagrams for explaining an example in the case where a film is peeling off by the manufacturing method of a display device in a comparative example. An organic resin film (flexible substrate 30) is peeled off and a space S1 is formed in a part between the glass substrate 10 and flexible substrate 30 shown in FIG. 5A. This space S1 sometimes forms a rupture part S2 when the flexible substrate 30 and a layer including the transistor part 110 in an upper layer therein ruptures as is shown in FIG. 5B. In addition, even if the space S1 is formed to the extent shown in FIG. 5A at the time when a thermal process is performed, the space S1 sometimes transforms in the rupture part S2 as the manufacturing processes progress.

When the rupture part S2 is produced, fragments of a film are created which leads to contamination of the device. As a result, it is necessary to remove the substrate from the manufacturing process at the stage where the space S1 is formed before the rupture part S2 is produced. At this time, even in the case where the space S1 occurs only in a part of the substrate, it is necessary to remove the entire substrate from the manufacturing process which leads to a significant drop in yield.

On the other hand, as described above, the peeling film phenomenon, that is, the generation of the space S1, can be significantly suppressed by cleaning the first surface of the glass substrate 10 in the present embodiment using hydrofluoric acid. This improves adhesion between the glass substrate 10 and the organic resin film which becomes the flexible substrate 30.

In order to confirm an improvement in adhesion, the adhesive force of the polyimide with respect to the glass substrate is measure using a peeling test. As a result it was confirmed that there was an increase in the adhesive force of about two times in the case where cleaning was performed using hydrofluoric acid compared to the case where cleaning is performed using only pure water without hydrofluoric acid before forming the polyimide film on the glass substrate 10.

In this way, by forming an organic resin film which becomes the flexible substrate 30 upon cleaning using hydrofluoric acid above the glass substrate 10, the adhesive force between the glass substrate 10 and flexible substrate 30 is improved. As a result, it is possible suppress the peeling phenomenon of the flexible substrate 30 from the glass substrate 10 during subsequent manufacturing processes.

Next, the manufacturing method of the display device after forming the transistor part 110 (FIG. 4C) is explained.

Figure 6A:
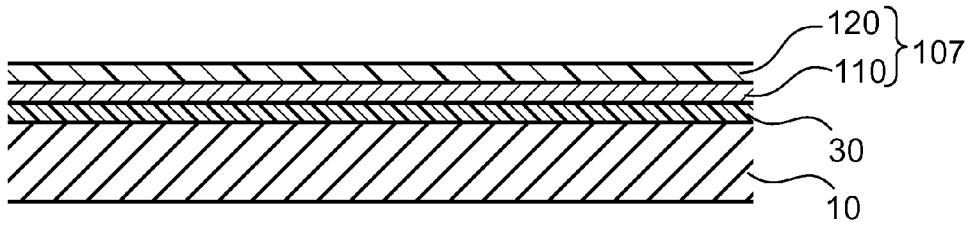
FIG. 6A~FIG. 6D are diagrams for explaining a method of manufacturing a display device subsequent to FIG. 4 in one embodiment.

FIG. 6A~6D are diagrams for explaining a manufacturing method of a display device continuing from FIG. 4 in one embodiment. As is shown in FIG. 6A, the light emitting element 120 is formed after forming the transistor part 110. In this way, a layer including the display element 107 which includes the transistor part 110 and light emitting element 120 is formed.

Figure 6B:
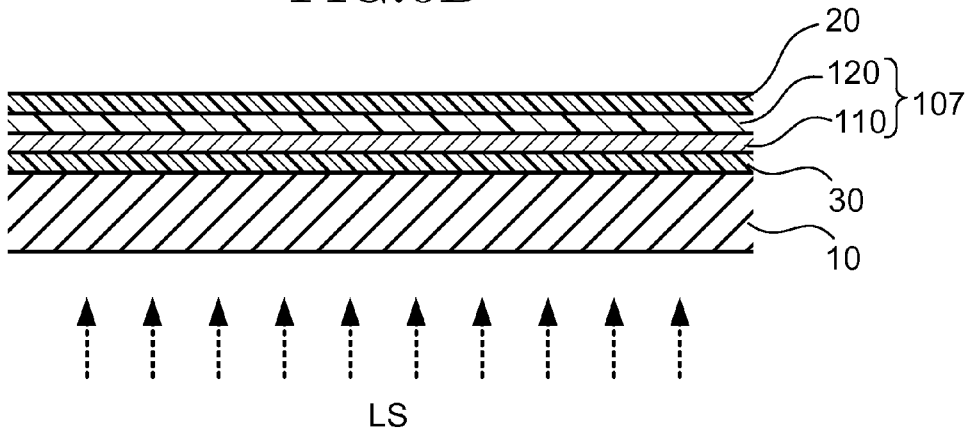

Next, as is shown in FIG. 6B, the opposing substrate 20 is bonded with a substrate formed with a layer including the display element 107 (transistor part 110 and light emitting element 120) so as to cover the display element 107 and the display element 107 is sealed. At this time, a filler may be filled between the light emitting element 120 and the opposing substrate 20 and the opposing substrate 20 may be bonded using a seal agent. The opposing substrate 20 is formed using an organic resin film for example, a material having flexibility the same as the flexible substrate 30. As described above, a color filter and the like may be formed on the opposing substrate 20.

In addition, when laser light LS is irradiated from the glass substrate 10 side, the laser light LS is absorbed by the organic resin film at the boundary between the flexible substrate 30 and glass substrate 10 and heated. In this way, the organic resin film is decomposed and the adhesive force between the glass substrate 10 and flexible substrate 30 is weakened. The laser light LS may also be irradiated to an entire region or one part where the glass substrate 10 and flexible substrate 30 are to be separated. In addition, the light to be irradiated is not limited to laser light and may be light generated by a lamp etc. In addition, although the wavelength of the light to be irradiated includes ultraviolet rays, the light may also have other wavelengths which allow the light to pass through the glass substrate 10 (or partially absorbed) and absorbed by the flexible substrate 30. Furthermore, the conditions such as irradiation intensity of the light may be appropriately set so that the adhesive force between the flexible substrate 30 and glass substrate 10 is decreased so that peeling is possible.

Furthermore, the timing when irradiation of the light is performed is not limited to after bonding of the opposing substrate 20. Irradiation may be performed either before bonding of the substrate 20, before forming the light emitting layer 11 or after a thermal process is completed when forming the transistor part 110. After completion of a thermal process refers to after a process of heating to a temperature to the extent that the glass substrate 10 and flexible substrate 30 may be peeled. In the case where light is irradiated before the opposing substrate 20 is bonded, the process of peeling the glass substrate 10 from the flexible substrate 30 may be performed immediately after the irradiation or after the opposing substrate 20 is bonded. In the case where peeling is performed immediately after irradiation, the subsequent manufacturing processes proceed while the glass substrate 20 is in a peeled state.

Figure 6C:
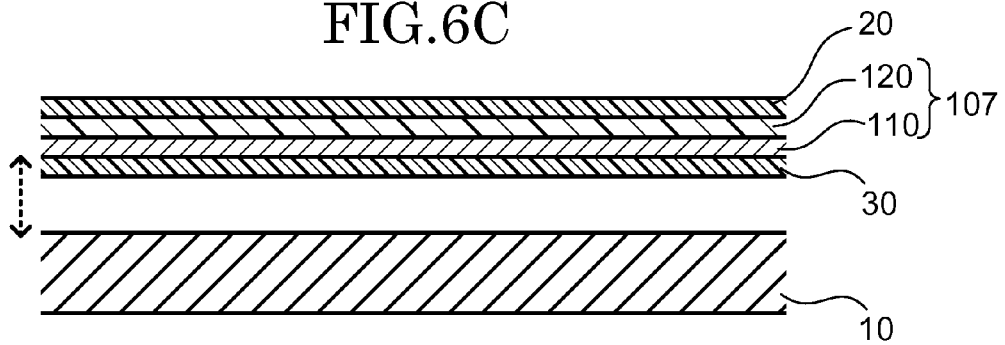

In this way, although the adhesive force between the glass substrate 10 and flexible substrate 30 is improved by a hydrofluoric acid process, the adhesive force is decreased by a decomposition of at least one part due to absorption of light in the organic resin film, thereby it is possible to easily peel the glass substrate 10 from the flexible substrate 30 as is shown in FIG. 6C.

Furthermore, in the case where a plurality of display devices 100 are formed collectively in one glass substrate 10, a break up process is included for each of the display devices 100. The timing for performing this break up process may be before peeling of the glass substrate 10 from the flexible substrate 30 or in the case of before peeling, before or after the laser light LS is irradiated. In the case where the break up process is performed before peeling, it is not necessary to separate the glass substrate 10. For example, the flexible substrate 30, opposing substrate 20 and a layer there between may be separated for each display device 100 so that it is not necessary to separate to the glass substrate 10.

Figure 6D:
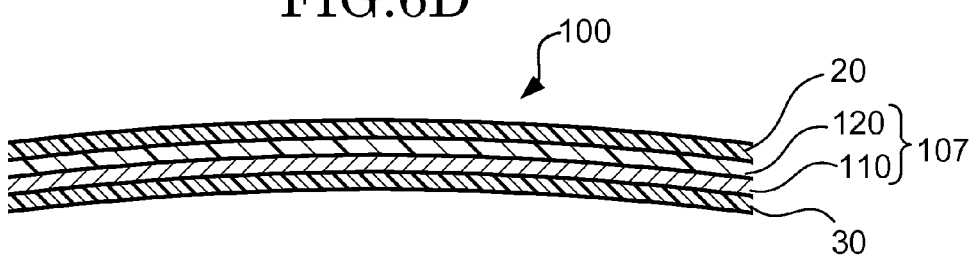

The display device 100 obtained in this way includes the flexible substrate 30 peeled from the glass substrate 10, the transistor part 10, the light emitting element 120 and the opposing substrate 20 and also includes flexibility as is shown in FIG. 6D.

In addition, in the manufacturing method of the display device 100 in the present embodiment, by forming an organic resin film as the flexible substrate 30 after cleaning the glass substrate 10 using hydrofluoric acid, the adhesive force between the glass substrate 10 and the flexible substrate 30 is improved. In this way, it is possible to suppress peeling of the flexible substrate 30 from the glass substrate 10 ad improve yield by performing a thermal process in the manufacturing process of the transistor part 110.

In addition, in a process after a thermal process is completed when forming the transistor part 110, light is irradiated on the flexible substrate 30 from the glass substrate 10 side and the adhesive force between the flexible substrate 30 and glass substrate 10 is decreased. In this way, it is possible to easily peel the glass substrate 10 from the flexible substrate 30.

Furthermore, the display device 100 may be used without peeling the glass substrate 10 from the flexible substrate 30. In this case a process for decreasing the adhesive force between the glass substrate 10 and flexible substrate 30 may not be performed, that is, a process for irradiating light may not be performed.

In the category of the concept of the present invention, a person ordinarily skilled in the art could conceive of various modifications and correction examples and could understand that these modifications and correction examples belong to the scope of the present invention. For example, with respect to each embodiment described above, a person ordinarily skilled in the art could appropriately perform an addition or removal of structural components or design modification or an addition of processes or an omission or change in conditions which are included in the scope of the present invention as long as they do not depart from the subject matter of the present invention.

What is claimed is:

1. A method of manufacturing a display device comprising:
exposing a first surface of a glass substrate to an aqueous solution containing hydrogen fluoride;
forming an organic resin film having a polar group on the first surface of the glass substrate, without forming another film between the organic resin film and the first surface;
forming a layer including a display element for displaying an image above the organic resin film; and
bonding an opposing substrate so as to cover the display element.

2. The method of manufacturing a display device according to claim 1, wherein after the opposing substrate is bonded, light is irradiated on the organic resin film from the glass substrate side to decompose at least one part of the organic resin film at the boundary between the organic resin film and the glass substrate, and after the light is irradiated, the glass substrate is peeled from the organic resin film.

3. The method of manufacturing a display device according to claim 1, wherein a heat treatment is performed when forming the layer including the display element, light is irradiated on the organic resin film from the glass substrate side after the heat treatment, and the glass substrate is peeled from the organic resin film after the opposing substrate is bonded.

4. The method of manufacturing a display device according to claim 1, wherein the organic resin film includes a polyimide.

5. The method of manufacturing a display device according to claim 4, wherein the heat treatment is performed at least 300° C. or more when forming the display element.

6. The method of manufacturing a display device according to claim 5, wherein the display element includes a thin film transistor.

7. A method of manufacturing a display device comprising:
exposing a first surface of a glass substrate to an aqueous solution containing hydrogen fluoride;
forming an organic resin film having a polar group so that the entire first surface of the organic resin film contacts with the first surface of the glass substrate;
forming a layer including a display element for displaying an image above the organic resin film; and
bonding an opposing substrate so as to cover the display element.

8. The method of manufacturing a display device according to claim 7, wherein after the opposing substrate is bonded, light is irradiated on the organic resin film from the glass substrate side to decompose at least one part of the organic resin film at the boundary between the organic resin film and the glass substrate, and after the light is irradiated, the glass substrate is peeled from the organic resin film.

9. The method of manufacturing a display device according to claim 7, wherein a heat treatment is performed when forming the layer including the display element, light is irradiated on the organic resin film from the glass substrate side after the heat treatment, and the glass substrate is peeled from the organic resin film after the opposing substrate is bonded.

10. The method of manufacturing a display device according to claim 7, wherein the organic resin film includes a polyimide.

11. The method of manufacturing a display device according to claim 10, wherein the heat treatment is performed at least 300° C. or more when forming the display element.

12. The method of manufacturing a display device according to claim 11, wherein the display element includes a thin film transistor.

* * * * *